United States Patent
Han et al.

(10) Patent No.: US 7,476,615 B2
(45) Date of Patent: Jan. 13, 2009

(54) DEPOSITION PROCESS FOR IODINE-DOPED RUTHENIUM BARRIER LAYERS

(75) Inventors: Joseph H. Han, San Jose, CA (US); Harsono S. Simka, Saratoga, CA (US); Adrien R. Lavoie, Beaverton, OR (US); Juan E. Dominguez, Hillsboro, OR (US); John J. Plombon, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 251 days.

(21) Appl. No.: 11/591,792

(22) Filed: Nov. 1, 2006

(65) Prior Publication Data

US 2008/0102632 A1   May 1, 2008

(51) Int. Cl.
*H01L 21/44* (2006.01)
(52) U.S. Cl. .................. 438/650; 438/643; 438/686; 257/E21.17; 257/E23.072
(58) Field of Classification Search .......... 438/643, 438/650, 686
See application file for complete search history.

(56) References Cited

U.S. PATENT DOCUMENTS

| | | | |
|---|---|---|---|
| 7,041,596 B1 * | 5/2006 | Dalton et al. | 438/650 |
| 2004/0166658 A1 * | 8/2004 | Kelber et al. | 438/597 |
| 2006/0229462 A1 * | 10/2006 | Thompson | 556/137 |
| 2007/0190779 A1 * | 8/2007 | Garg et al. | 438/643 |
| 2007/0202678 A1 * | 8/2007 | Plombon et al. | 438/597 |
| 2008/0054472 A1 * | 3/2008 | Shinriki et al. | 257/762 |

* cited by examiner

*Primary Examiner*—Alexander G Ghyka
(74) *Attorney, Agent, or Firm*—Rahul D. Engineer

(57) ABSTRACT

An iodine-doped ruthenium barrier layer for use with copper interconnects within integrated circuits is formed using novel, iodine-containing ruthenium precursors in an ALD or CVD process. Ruthenium precursors that may be used include ruthenium containing carbonyls, arenes, cyclopentadienyls, and certain other ruthenium containing compounds. The ruthenium precursors include iodine to catalyze a subsequent copper metal deposition and to smooth the surface of the ruthenium layer. The iodine concentration across the thickness of the ruthenium barrier layer may be constant or may be graded.

45 Claims, 8 Drawing Sheets

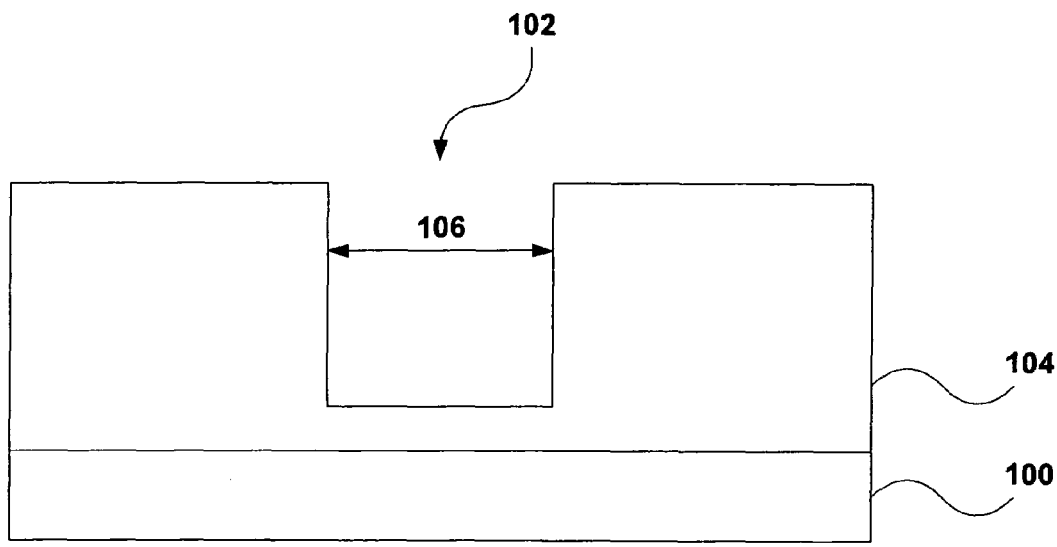
FIG._1A
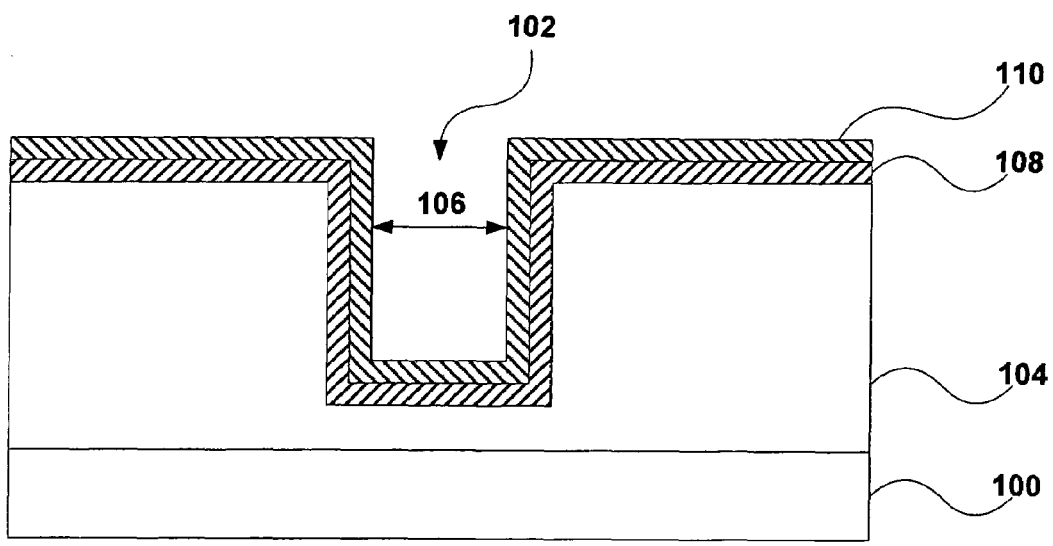
FIG._1B

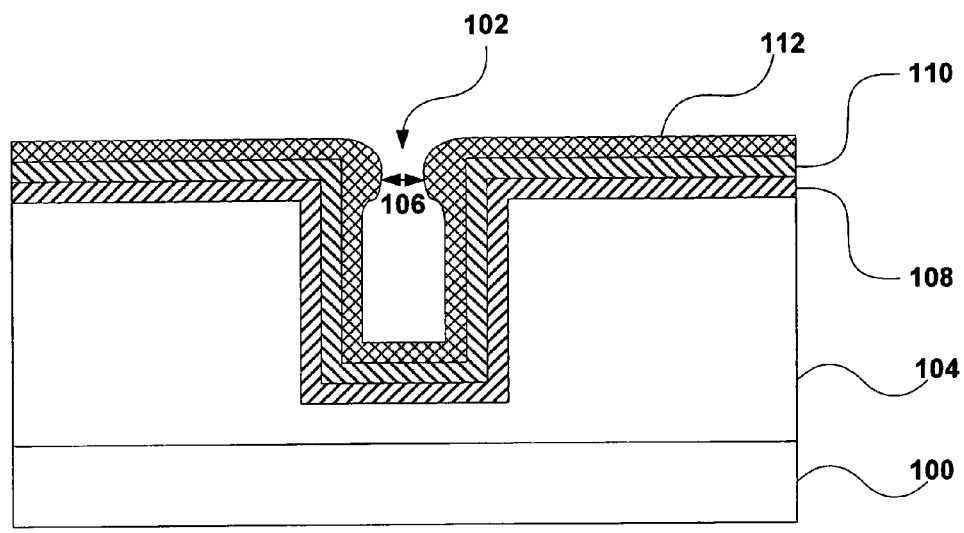
FIG._1C
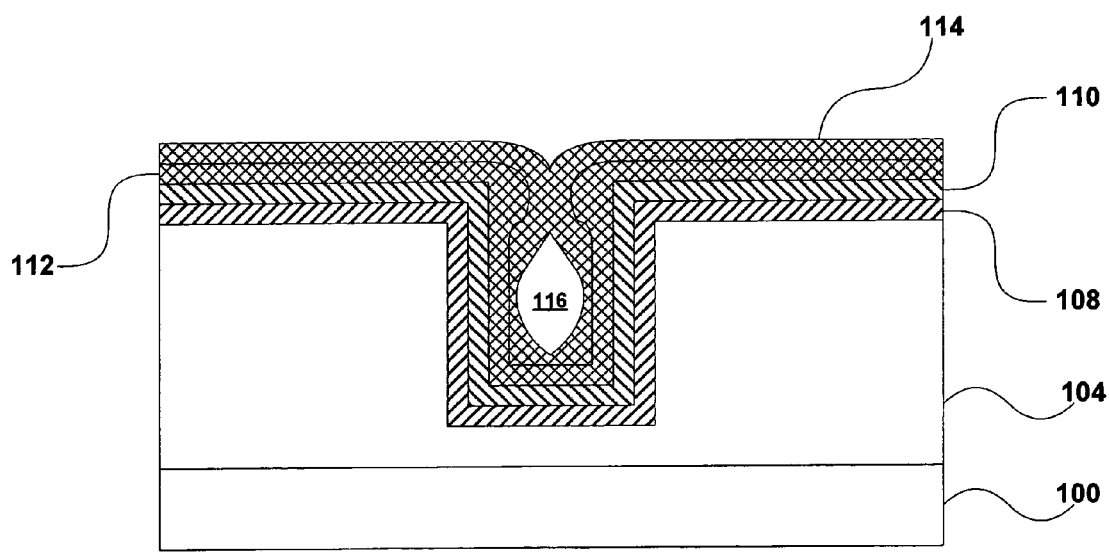
FIG._1D

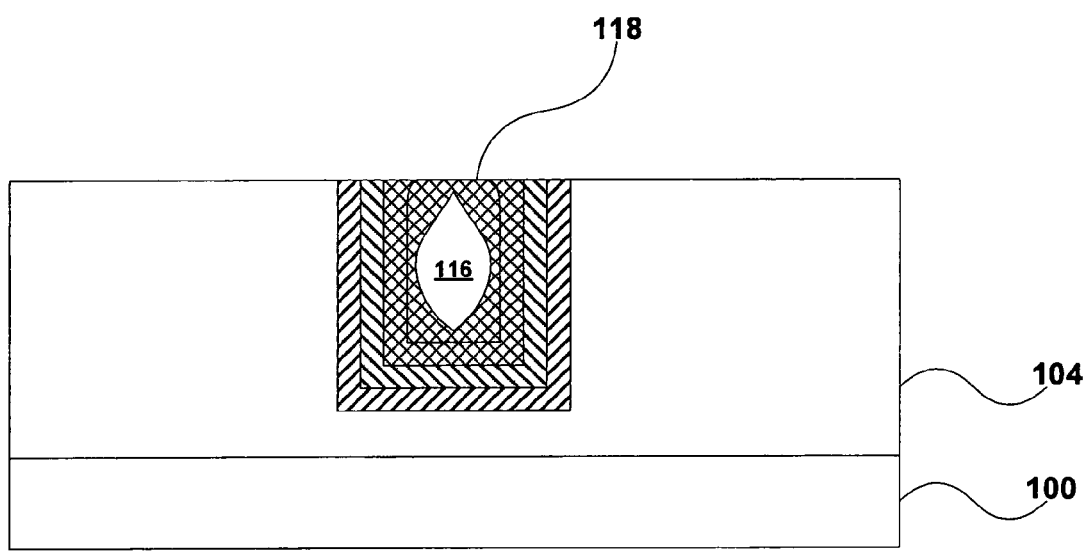
FIG._1E

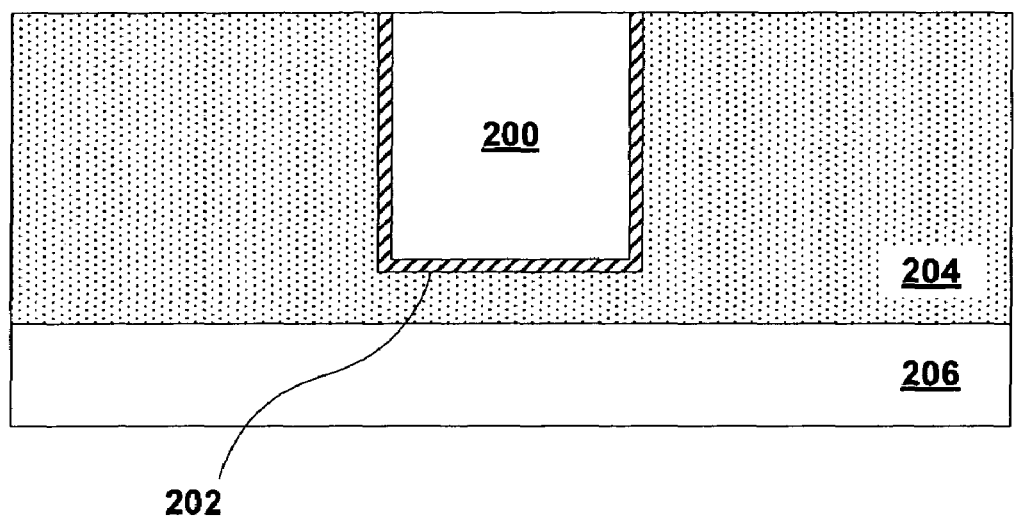
FIG._2

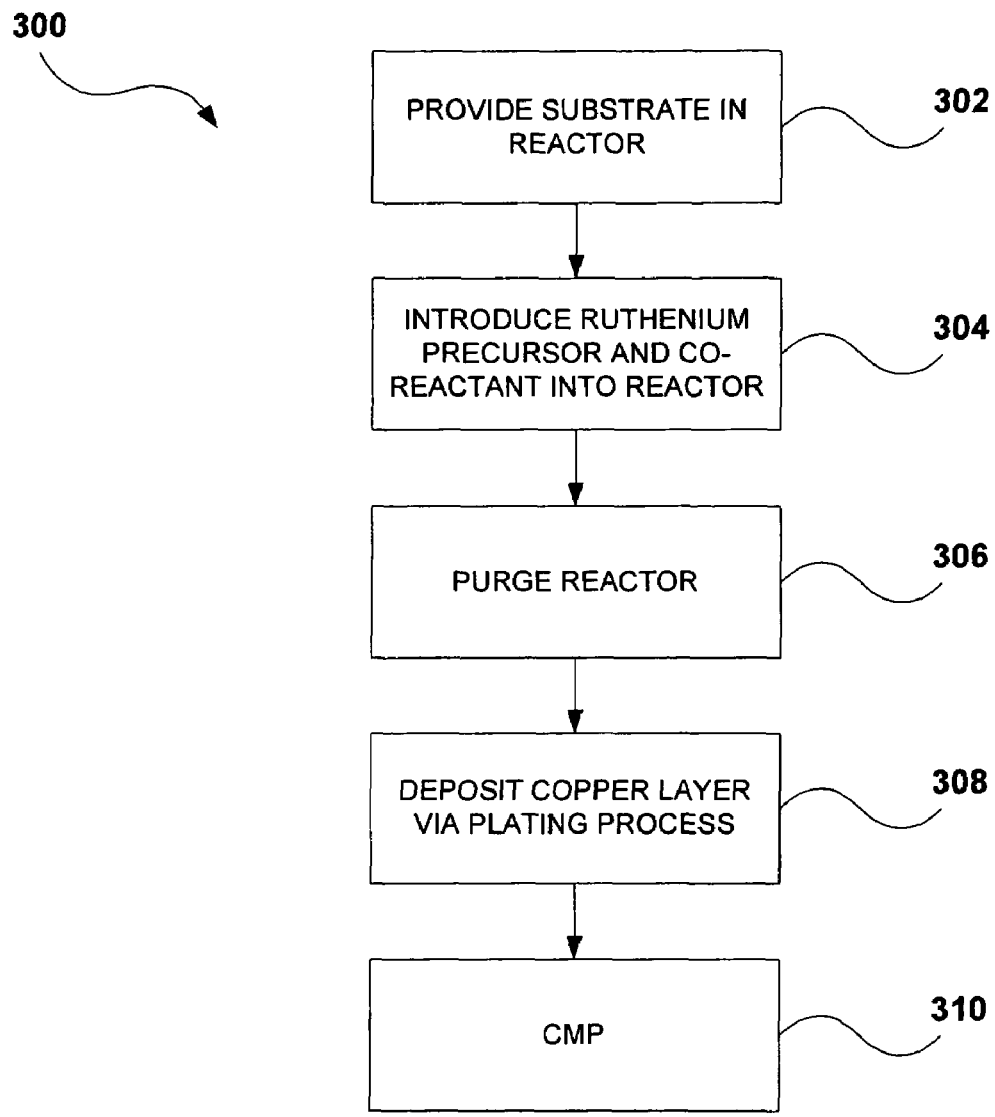
FIG._3

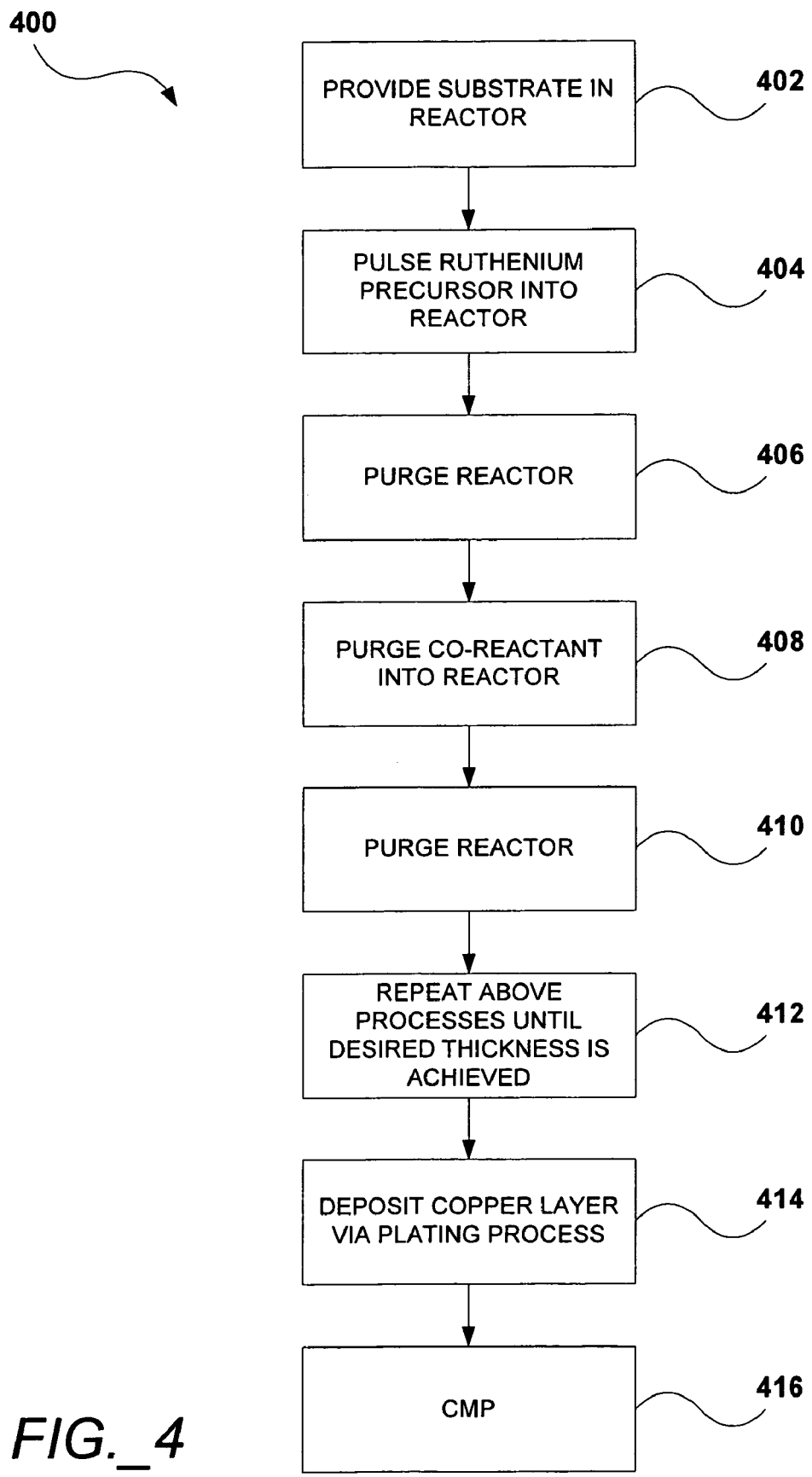
FIG._4

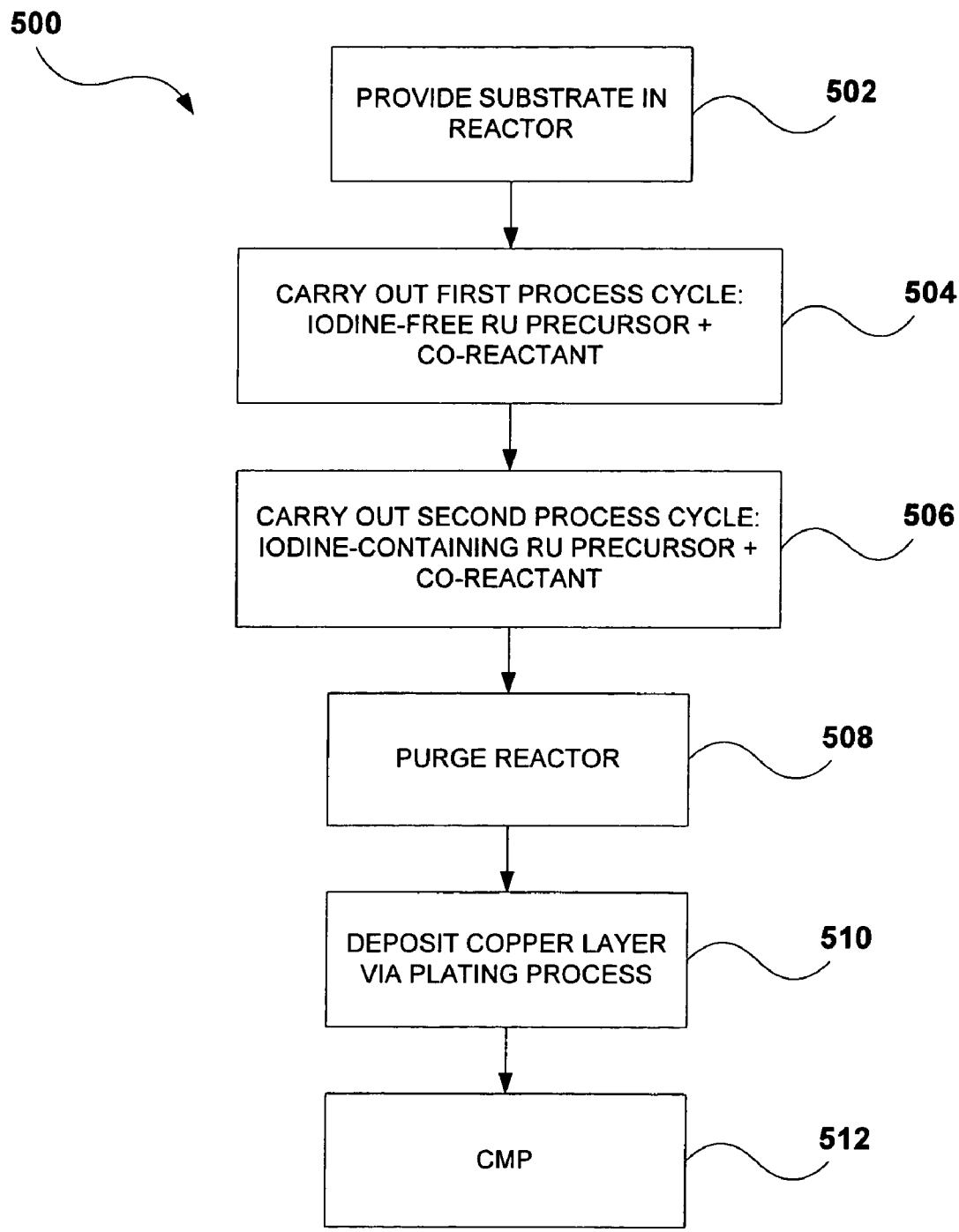
FIG._5

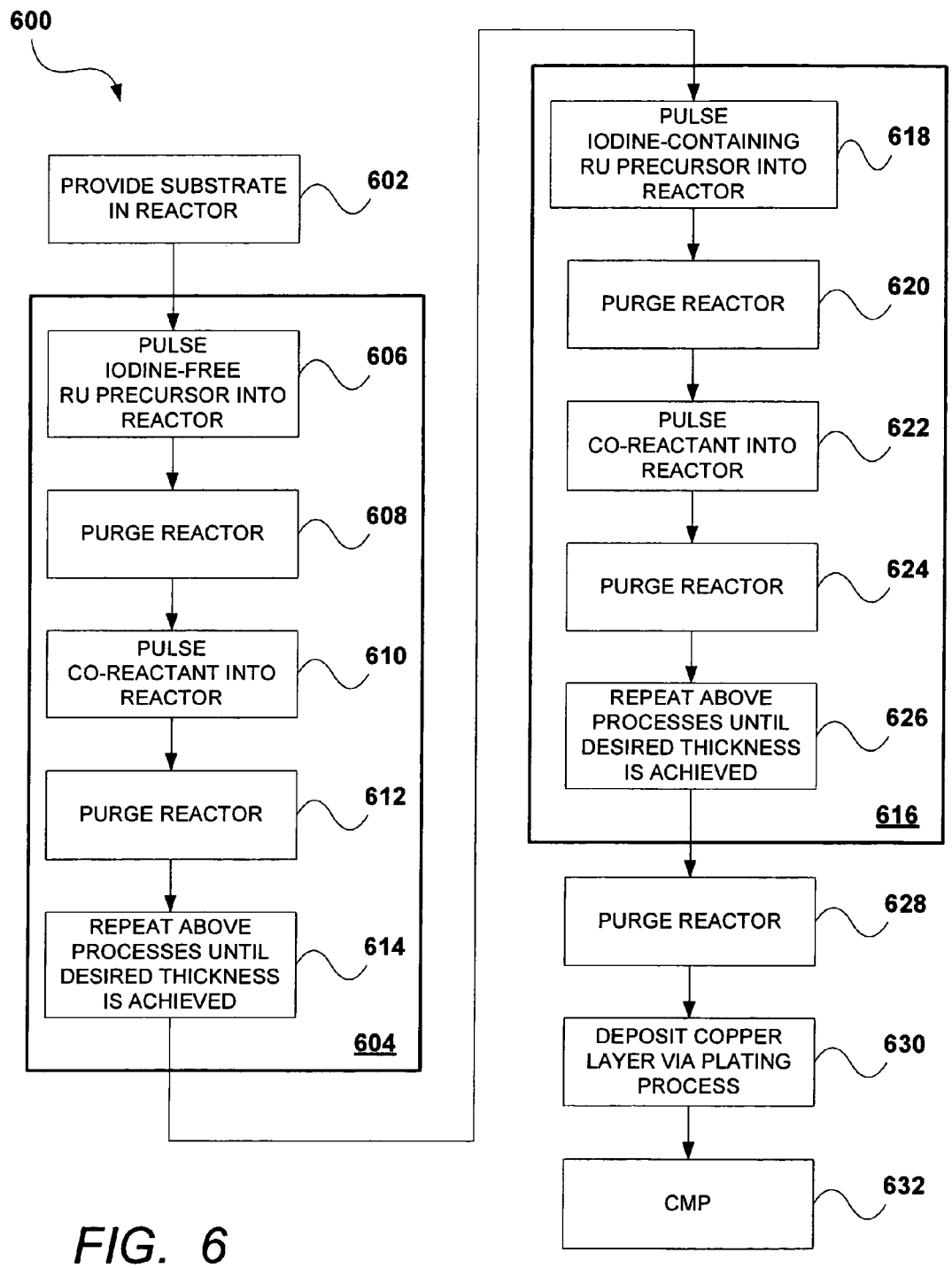
FIG._6

DEPOSITION PROCESS FOR IODINE-DOPED RUTHENIUM BARRIER LAYERS

BACKGROUND

In the manufacture of integrated circuits, copper interconnects are generally formed on a semiconductor substrate using a copper dual damascene process. Such a process begins with a trench being etched into a dielectric layer and filled with a barrier layer, an adhesion layer, and a seed layer. A physical vapor deposition (PVD) process, such as a sputtering process, may be used to deposit a tantalum nitride (TaN) barrier layer and a tantalum (Ta) or ruthenium (Ru) adhesion layer (i.e., a TaN/Ta or TaN/Ru stack) into the trench. The TaN barrier layer prevents copper from diffusing into the underlying dielectric layer. The Ta or Ru adhesion layer is required because the subsequently deposited metals do not readily nucleate on the TaN barrier layer. This may be followed by a PVD sputter process to deposit a copper seed layer into the trench. An electroplating process is then used to fill the trench with copper metal to form the interconnect.

As device dimensions scale down, the aspect ratio of the trench becomes more aggressive as the trench becomes narrower. This gives rise to issues such as trench overhang during the copper seed deposition, leading to pinched-off trench openings during plating and inadequate gapfill. Additionally, as trenches decrease in size, the ratio of barrier metal to copper metal in the overall interconnect structure increases, thereby increasing the electrical line resistance and RC delay of the interconnect.

One approach to addressing these issues is to reduce the thickness of the TaN/Ta or TaN/Ru stack, which widens the available gap for subsequent metallization and increases the final copper volume fraction. Unfortunately, this is often limited by the non-conformal characteristic of PVD deposition techniques. Accordingly, alternative techniques for reducing the thickness of the barrier and adhesion layer are needed.

BRIEF DESCRIPTION OF THE DRAWINGS

FIGS. 1A to 1E illustrate a conventional damascene process for forming metal interconnects.

FIG. 2 illustrates a ruthenium barrier and adhesion layer.

FIG. 3 is a method for forming a ruthenium layer using a chemical vapor deposition process in accordance with an implementation of the invention.

FIG. 4 is a method for forming a ruthenium layer using an atomic layer deposition process in accordance with an implementation of the invention.

FIG. 5 is a method for forming a graded ruthenium layer using a chemical vapor deposition process in accordance with an implementation of the invention.

FIG. 6 is a method for forming a graded ruthenium layer using an atomic layer deposition process in accordance with an implementation of the invention.

DETAILED DESCRIPTION

Described herein are systems and methods of fabricating a ruthenium layer that functions as a barrier layer for a copper interconnect in an integrated circuit application. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention; however, the order of description should not be construed to imply that these operations are necessarily order dependent. In particular, these operations need not be performed in the order of presentation.

Implementations of the invention provide a ruthenium layer deposited by way of an atomic layer deposition process or a chemical vapor deposition process that may be used to replace the conventional barrier layer and adhesion layer used for copper interconnects in integrated circuit applications. For instance, a ruthenium layer prepared in accordance with the invention may be used to replace the conventional TaN/Ta or TaN/Ru stack with a single layer. The result is a thinner barrier and adhesion layer that substantially reduces the occurrence of trench overhang and void formation in the copper interconnect. The thinner barrier and adhesion layer also increases the final copper volume fraction of the interconnect, thereby improving electrical line resistance.

For reference, FIGS. 1A to 1E illustrate a conventional damascene process for fabricating copper interconnects on a semiconductor wafer. FIG. 1A illustrates a substrate 100, such as a semiconductor wafer, that includes a trench 102 that has been etched into a dielectric layer 104. The trench 102 includes a gap 106 through which metal may enter during metallization processes.

FIG. 1B illustrates the trench 102 after a conventional barrier layer 108 and a conventional adhesion layer 110 have been deposited. The barrier layer 108 prevents copper metal from diffusing into the dielectric layer 104. The adhesion layer 110 enables copper metal to become deposited onto the barrier layer 108. The barrier layer 108 is generally formed using a material such as tantalum nitride (TaN) and is deposited using a PVD process. The barrier layer 108 may be around 3 Angstroms (Å) to 10 nanometers (nm) thick, although it is generally around 5 nm thick. The adhesion layer 110 is generally formed using a metal such as tantalum (Ta) or ruthenium (Ru) and is also deposited using a PVD process. The adhesion layer 110 is generally around 5 nm to 10 nm thick.

After the adhesion layer 110 is formed, the conventional damascene process of FIG. 1 uses two independent deposition processes to fill the trench 102 with copper metal. The first deposition process is a PVD process that forms a non-conformal copper seed layer. The second deposition process is a plating process, such as an electroplating (EP) process or an electroless plating (EL) process, that deposits a bulk copper layer to fill the trench 102.

FIG. 1C illustrates the trench 102 after a conventional copper seed layer 112 has been deposited onto the adhesion layer 110 using a PVD process. The copper seed layer 112 enables or catalyzes a subsequent plating process to fill the interconnect with copper metal. FIG. 1D illustrates the trench 102 after an EP or EL copper deposition process has been carried out. Copper metal 114 enters the trench through the gap 106 where, due to the narrow width of the gap 106, issues such as trench overhang and pinching off of the trench opening may occur that lead to defects in the plating step. For instance, as shown in FIG. 1D, trench overhang may occur that pinches off the opening of the trench 102, creating a void 116 that will appear in the final interconnect structure.

FIG. 1E illustrates the trench 102 after a chemical mechanical polishing (CMP) process is used to planarize the deposited copper metal 114. The CMP results in the formation of a metal interconnect 118. As shown, the metal interconnect 118 includes the void 116 that was formed when the available gap 106 was too narrow and the resulting trench overhang pinched off the trench opening. Furthermore, a substantial portion of the metal interconnect 118 comprises Ta and/or Ru from the adhesion layer 110 and the barrier layer 108, which decreases the percentage of copper in the final interconnect and increases the RC delay.

Other potential fabrication methods for copper interconnects suffer from drawbacks as well. For instance, for features with aggressive aspect ratios, the use of a ruthenium barrier layer deposited using a physical vapor deposition (PVD) process may still result in significant trench overhang and poor sidewall coverage. This may lead to voids in the copper interconnect. For ruthenium layers deposited using a plasma enhanced process, the ruthenium layer may lead to surface roughness much higher than that of conventional barrier and seed layers as well as potential non-conformality. Furthermore, bottom-up fill of trenches and vias with copper is not possible using a chemical vapor deposition or atomic layer deposition process on a conventional PVD ruthenium layer.

In accordance with the invention, novel organometallic precursors are used in a chemical vapor deposition (CVD) process or an atomic layer deposition (ALD) process to form a ruthenium barrier layer. Chemical vapor deposition is a chemical deposition process where the semiconductor substrate is exposed to one or more volatile precursors that react and/or decompose on the substrate surface to produce the desired deposit. Atomic layer deposition is an activated deposition process (e.g., using thermal, plasma, or other activation methods) where reactants are introduced separately. Both ALD and CVD type processes generally result in highly conformal film growth due to surface reaction limitations rather than species transport limitations. As such, thinner and conformal ruthenium layers may be grown with precise thickness control in contrast to other processes such as PVD. This allows reducing the ruthenium layer thickness to avoid formation of an overhang, while still ensuring sufficient ruthenium thickness at the trench sidewalls and bottom. The resulting CVD or ALD ruthenium layer therefore does not suffer from the issues that plague conventional barrier and adhesion layers.

Furthermore, the novel organometallic precursors used herein produce ruthenium barrier layers that are doped with iodine. The inclusion of iodine in the ruthenium layer of the invention improves surface roughness (i.e., a smoother surface is generated) and catalytically enhances a subsequent CVD or ALD copper deposition process to enable bottom-up fill for trenches and vias in the dielectric layer.

FIG. 2 illustrates a copper interconnect 200 formed within a trench of a dielectric layer 204 upon a substrate 206. The copper interconnect 200 is located within metallization layers of an integrated circuit (IC) die and is used to interconnect transistors and other structures formed on a device layer. The substrate 206 may be a portion of a semiconductor wafer. The dielectric layer 204 may be formed using conventional dielectric materials including, but not limited to, oxides such as silicon dioxide ($SiO_2$) and carbon doped oxide (CDO), silicon nitride, organic polymers such as perfluorocyclobutane (PFCB), and fluorosilicate glass (FSG). In accordance with an implementation of the invention, a ruthenium layer 202 is formed between the copper interconnect 200 and the dielectric layer 204 that functions as a barrier layer to prevent the copper metal from diffusing into the dielectric layer 204. In some implementations, the ruthenium layer 202 may be doped with iodine to improve the bottom-up fill properties in electroless plating or electroplating processes commonly used to deposit copper metal. The copper deposition may include the deposition of a copper seed layer and a bulk copper layer. Alternately, a copper seed layer may be unnecessary and a copper layer may be plated directly on the ruthenium layer. In implementations of the invention, the ruthenium layer 202 may have a thickness that ranges from 1 nm to 15 nm.

In accordance with implementations of the invention, the ruthenium layer 202 may be formed using an ALD process, a plasma enhanced ALD (PEALD) process, a CVD process, or a plasma enhanced CVD (PECVD) process. Fluorine-free precursors may be used to form the ruthenium layer 202. In the various implementations of the invention, ruthenium precursors that may be used include ruthenium containing carbonyls, arenes, cyclopentadienyls (Cp), and certain other ruthenium containing compounds. The ruthenium precursors may also include iodine to catalyze a subsequent copper metal deposition and to smooth the surface of the ruthenium layer.

FIG. 3 is a CVD method 300 for fabricating a ruthenium barrier layer and a copper interconnect in accordance with an implementation of the invention. The method 300 begins by providing a semiconductor substrate onto which the copper interconnect may be formed (302). The substrate may be a silicon wafer having at least one dielectric layer deposited on its surface. The dielectric layer may include one or more trenches and/or vias within which the ruthenium layer will be deposited and the copper interconnect will be formed. The dielectric layer may be formed from conventional materials used in dielectric layers, including but not limited to $SiO_2$ and CDO. The substrate may be housed in a reactor in preparation for the CVD process. The substrate may be heated within the reactor to a temperature between around 50° C. and around 400° C. and the reactor may be heated to a temperature that ranges from 50° C. to 400° C. The pressure within the reactor may range from 0.05 Torr to 3.0 Torr.

Next, a process cycle is carried out in which at least one ruthenium precursor and at least one co-reactant are introduced into the reactor to react and form a ruthenium layer or a light-element doped ruthenium layer (e.g., RuN) (304). The process cycle may introduce the ruthenium precursor and the co-reactant into the reactor in discrete pulses or in a continuous manner.

In accordance with implementations of the invention, the at least one ruthenium precursor is chosen from the following precursors: carbonyl ruthenium precursors including, but are not limited to, the triiodomethyl substituted pyrazolate compound $[Ru(CO)_3(3,5-(I_3C)_2-pz)]_2$, $Ru(CO)(thd)(3,5-(I_3C)_2-pz)$ where thd=tetrahydrodionato, (acrylonitrile)$Ru(CO)_3(3,5-(I_3C)_2-pz)$, $[Ru(CO)_2(COD)(3,5-(I_3C)_2-pz)]_2$ where COD=cyclooctadiene, and (butene)$Ru(CO)_2(3,5-(I_3C)_2-pz)$; arene ruthenium precursors including, but are not limited to, (benzene)$Ru(3,5-(I_3C)_2-pz)$; and Cp ruthenium precursors including, but are not limited to, $CpRu(CO)(3,5-(I_3C)_2-pz)$ and $[CpRu(CO)(3,5-(I_3C)_2-pz)]_2$. Other ruthenium precursors that may be used include, but are not limited to, $(COD)_2Ru(3,5-(I_3C)_2-pz)$, $[Ru(CO)_2(Allyl)(3,5-(I_3C)_2-pz)]_2$, and $[Ru(CO)_2(C_6H_8)(3,5-(I_3C)_2-pz)]_2$. In some implementations of the invention, the above listed precursors may be modified by mixing of the ratio of ligands or substituting analogues of ligands. In other implementations, more than one of the ruthenium precursors, each having different ligands, may be used simultaneously in the CVD process.

The at least one co-reactant may include, but is not limited to, atomic hydrogen, molecular hydrogen ($H_2$), $NH_3$, oxygen ($O_2$), and ozone ($O_3$). In further implementations, co-reactants may include $BH_3$, $B_2H_6$, catechol-borane, methane ($CH_4$), silane ($SiH_4$), $GeH_4$, metal hydrides, carbon monoxide (CO), and ethanol. In still further implementations, a different metal precursor such as those for aluminum, copper, ruthenium, and tantalum may be used as a co-reactant to alloy with the ruthenium metal during deposition to improve resistive properties or diffusion barrier properties of the ruthenium layer. In addition, the use of the above listed co-reactants may be combined with a plasma source.

In various implementations of the invention, the following process parameters may be used for the introduction of the ruthenium precursor into the CVD reactor. The ruthenium precursor may flow into the reactor for a time period that ranges from 0.5 seconds to 10 seconds, depending upon the desired thickness of the final ruthenium layer. During this time the ruthenium precursor may have a flow rate of up to 10 standard liters per minute (SLM). The ruthenium precursor temperature may be between around 80° C. and 200° C. The vaporizer temperature may be around 60° C. to around 250° C.

In some implementations, a heated carrier gas may be employed with a temperature that generally ranges from around 60° C. to around 200° C. Carrier gases that may be used here include, but are not limited to, argon (Ar), xenon (Xe), helium (He), hydrogen ($H_2$), nitrogen ($N_2$), forming gas, or mixture of these gases. The flow rate of the carrier gas may range from around 100 standard cubic centimeters (SCCM) to around 200 SCCM.

In various implementations of the invention, the following process parameters may be used for the introduction of the co-reactant into the CVD reactor. The co-reactant may flow into the reactor for a time period that ranges from 0.5 seconds to 10 seconds, depending upon the desired thickness of the final ruthenium layer. The time duration of the co-reactant flow need not be the same as the time duration of the ruthenium precursor flow. During this time the co-reactant may have a flow rate of up to 10 SLM. The co-reactant temperature may be between around 80° C. and 250° C.

The precursor and co-reactant delivery lines into the reactor may be heated to a temperature that ranges from 60° C. to 250° C., or alternately, to a temperature that is at least 10° C. hotter than the volatile precursor and co-reactant flow temperatures within the delivery lines to avoid condensation of the precursor and/or the co-reactant. Before discharge, the delivery line pressure may be set to around 0 to 5 psi, the orifice may be between 0.1 mm and 1.0 mm in diameter.

Finally, an RF energy source may be applied at a power that ranges from 5 Watts (W) to 200 W and at a frequency of 13.56 MHz, 27 MHz, or 60 MHz. It should be noted that the scope of the invention includes any possible set of process parameters that may be used to carry out the implementations of the invention described herein.

The above process results in the formation of an iodine-containing ruthenium layer on the dielectric layer. Once the ruthenium layer has reached a desired thickness, the CVD process may end. The reactor may then be purged (306). The purge gas may be an inert gas such as Ar, Xe, $N_2$, He, or forming gas and the duration of the purge may range from 0.1 seconds to 60 seconds, depending on the CVD reactor configurations and other deposition conditions. In most implementations of the invention, the purge may range from 0.5 seconds to 5 seconds.

Following the formation of the ruthenium layer, the substrate may be transferred to a reactor containing a plating bath and a plating process may be carried out to deposit a metal layer, such as a copper layer, over the ruthenium layer (308). The copper layer fills the trench with copper to form the copper interconnect. The copper metal enters the trench where, due to the relatively large width of the trench enabled by the thin ruthenium layer, issues such as void formation due to overhang are reduced or eliminated. In some implementations, the plating bath is an electroplating bath and the plating process is an electroplating process that is catalyzed by the inclusion of iodine in the ruthenium layer. In other implementations, the plating bath is an electroless plating bath and the plating process is an electroless plating process that is also catalyzed by the inclusion of iodine in the ruthenium layer.

In further implementations, a copper seed layer may be deposited using an electroless plating process before the copper layer is deposited. Alternately, a copper seed layer may be deposited using a CVD or an ALD process prior to filling the trench using an electroplating or electroless plating process. In yet another implementation, the CVD or ALD process may be used to fill the entire trench with copper to form the copper interconnect, where the iodine catalyzes a gas-phase deposition gap-fill without requiring any plating steps. Finally, a chemical mechanical polishing (CMP) process may be used to planarize the deposited copper metal and finalize the copper interconnect structure (310).

FIG. 4 is an ALD method 400 for fabricating a ruthenium barrier layer and a copper interconnect in accordance with an implementation of the invention. The method 400 begins by providing a semiconductor substrate onto which the copper interconnect may be formed (402). The substrate may be a silicon wafer having at least one dielectric layer deposited on its surface. The dielectric layer may include one or more trenches and/or vias within which the ruthenium layer will be deposited and the copper interconnect will be formed. The dielectric layer may be formed from conventional materials used in dielectric layers, including but not limited to $SiO_2$ and CDO. The substrate may be housed in a reactor in preparation for the ALD process. The substrate may be heated within the reactor to a temperature between around 50° C. and around 250° C. and the reactor may be heated to a temperature that ranges from 50° C. to 250° C. The pressure within the reactor may range from 0.1 Torr to 3.0 Torr.

In accordance with an implementation of the invention, at least one pulse of a ruthenium precursor is introduced into the reactor (404). Organometallic precursors that may be used for the ruthenium precursor pulse may be chosen from the following precursors: carbonyl ruthenium precursors including, but are not limited to, the triiodomethyl substituted pyrazolate compound $[Ru(CO)_3(3,5-(I_3C)_2-pz)]_2$, $Ru(CO)(thd)(3,5-(I_3C)_2-pz)$ where thd=tetrahydrodionato, (acrylonitrile)Ru$(CO)_3(3,5-(I_3C)_2-pz)$, $[Ru(CO)_2(COD)(3,5-(I_3C)_2-pz)]_2$ where COD=cyclooctadiene, and (butene)Ru$(CO)_2(3,5-(I_3C)_2-pz)$; arene ruthenium precursors including, but are not limited to, (benzene)Ru$(3,5-(I_3C)_2-pz)$; and Cp ruthenium precursors including, but are not limited to, CpRu(CO)$(3,5-(I_3C)_2-pz)$ and $[CpRu(CO)(3,5-(I_3C)_2-pz)]_2$. Other ruthenium precursors that may be used include, but are not limited to, $(COD)_2Ru(3,5-(I_3C)_2-pz)$, $[Ru(CO)_2(Allyl)(3,5-(I_3C)_2-pz)]_2$, and $[Ru(CO)_2(C_6H_8)(3,5-(I_3C)_2-pz)]_2$. In some implementations of the invention, the above listed precursors may be modified by mixing of the ratio of ligands or substituting analogues of ligands. In other implementations, more than one of the ruthenium precursors, each having different ligands, may be used simultaneously in the ALD process.

In various implementations of the invention, the following process parameters may be used for the ruthenium precursor pulse. The ruthenium precursor pulse may have a duration that ranges from around 0.5 second to around 10 seconds with a flow rate of up to 10 standard liters per minute (SLM). The specific number of ruthenium precursor pulses may range from 1 pulse to 200 pulses or more depending on the desired thickness of the final ruthenium layer. The ruthenium precursor temperature may be between around 80° C. and 250° C. The vaporizer temperature may be around 60° C. to around 250° C.

A heated carrier gas may be employed with a temperature that generally ranges from around 60° C. to around 200° C. Carrier gases that may be used here include, but are not limited to, Ar, Xe, He, $H_2$, $N_2$, forming gas, or mixture of these gases. The flow rate of the carrier gas may range from around 100 SCCM to around 200 SCCM.

The precursor delivery line into the reactor may be heated to a temperature that ranges from around 60° C. to around 250° C., or alternately, to a temperature that is at least 25° C. hotter than the volatile precursor flow temperature within the delivery line to avoid condensation of the precursor. Generally the delivery line temperature may be around 120° C. Before discharge, the delivery line pressure may be set to around 0 to 5 psi, the orifice may be between 0.1 mm and 1.0 mm in diameter, and the charge pulse may be between 1 second and 5 seconds. The equilibration time with the valves closed may be 1 second to 5 seconds and the discharge pulse may be 1 second to 5 seconds.

Finally, an RF energy source may be applied at a power that ranges from 5 W to 200 W and at a frequency of 13.56 MHz, 27 MHz, or 60 MHz. It should be noted that the scope of the invention includes any possible set of process parameters that may be used to carry out the implementations of the invention described herein.

After the at least one pulse of the ruthenium precursor, the reactor may be purged (406). The purge gas may be an inert gas such as Ar, Xe, $N_2$, He, or forming gas and the duration of the purge may range from 0.1 seconds to 60 seconds, depending on the ALD reactor configurations and other deposition conditions. In most implementations of the invention, the purge may range from 2 seconds to 10 seconds.

In accordance with an implementation of the invention, at least one pulse of a co-reactant is then introduced into the reactor to react with the ruthenium precursor (408). In some implementations the co-reactant may be atomic hydrogen, molecular hydrogen, $NH_3$, $O_2$, and $O_3$. In further implementations, the co-reactant may be $BH_3$, $B_2H_6$, catechol-borane, methane ($CH_4$), silane ($SiH_4$), $GeH_4$, metal hydrides, carbon monoxide (CO), and ethanol. A plasma source may be used with or without a separate co-reactant to adjust growth rates and to control film morphology and impurity concentration. For instance, a hydrogen ($H_2$) plasma may be employed as a co-reactant in addition to or in lieu of the co-reactants provided above. In further implementations, a metal precursor may be used as a co-reactant to alloy with the ruthenium metal. Such metal precursors may include precursors for aluminum, copper, ruthenium, and tantalum. In various implementations of the invention, any combination of the co-reactants listed above, including the plasma and metal precursors, may be used.

Conventional process parameters may be used for the co-reactant pulse. For instance, in implementations of the invention, the process parameters for the co-reactant pulse include, but are not limited to, a co-reactant pulse duration of between around 1 second and 10 seconds, a co-reactant flow rate of up to 10 SLM, a reactor pressure between around 0.05 Torr and 3.0 Torr, a co-reactant temperature between around 80° C. and 200° C., a substrate temperature between around 100° C. and around 400° C., and an RF energy source that may be applied at a power that ranges from 5 W to 200 W and at a frequency of 13.56 MHz, 27 MHz, or 60 MHz. It should be noted that the scope of the invention includes any possible set of process parameters that may be used to carry out the implementations of the invention described herein.

For the $H_2$ plasma, process parameters that may be used include a flow rate of around 200 SCCM to around 600 SCCM, though the $H_2$ plasma flow rate will generally be around 300 SCCM. The $H_2$ plasma may be pulsed into the reactor with a pulse duration of around 0.5 seconds to around 4.0 seconds, with a pulse duration of around 1 to 2 seconds often being used. The plasma power may range from around 5 W to around 200 W and will generally range from around 60 W to around 200 W.

After the at least one pulse of the co-reactant, the reactor may again be purged (410). The purge gas may be an inert gas such as Ar, Xe, $N_2$, He, or forming gas and the duration of the purge may range from 0.1 seconds to 60 seconds, depending on the ALD reactor configurations and other deposition conditions. In most implementations of the invention, the purge may range from 2 seconds to 20 seconds.

The above processes result in the formation of a ruthenium layer on the dielectric layer. If the ruthenium layer has not yet reached a desired thickness, the above processes may be repeated as necessary until the desired thickness is reached (412).

As described above with the CVD process, following the formation of the ruthenium layer, the substrate may be transferred to a plating bath and a plating process may be carried out to deposit a copper layer over the ruthenium layer to form a copper interconnect (414). In some implementations, the plating bath is an electroplating bath and the plating process is an electroplating process that is catalyzed by the inclusion of iodine in the ruthenium layer. In other implementations, the plating bath is an electroless plating bath and the plating process is an electroless plating process that is also catalyzed by the inclusion of iodine in the ruthenium layer. In further implementations, a copper seed layer may be deposited using a CVD or ALD process prior to filling the trench using an electroplating process. And in yet another implementation, a CVD or ALD process may be used to fill the entire trench with copper metal where the iodine catalyzes a gas-phase deposition gap-fill. Finally, a CMP process may be used to planarize the deposited copper metal and finalize the copper interconnect structure (416).

It should be noted that in alternate implementations of the invention, the order of reactants may be changed. For instance, the ruthenium layer fabrication process may begin by pulsing one or more of the co-reactants into the reactor. The co-reactant pulse may be followed by a reactor purge. Next, the fabrication process may pulse the ruthenium precursor into the reactor where the precursor reacts with the co-reactant to form the ruthenium layer.

In alternate implementations of the invention, a graded ruthenium layer may be formed in which the iodine concentration varies across the thickness of the ruthenium layer. As described above, the inclusion of iodine affects the smoothness of the ruthenium layer and affects the rate of the catalytically enhanced copper CVD or ALD process. One potential issue, however, is the affect that iodine may have on the resistivity of the ruthenium layer. Therefore, fabricating a graded ruthenium layer where the iodine concentration is high near the ruthenium-copper interface and low elsewhere is advantageous.

In some implementations, the iodine concentration within the ruthenium layer may be controlled through precursor mixing and plasma conditions. For instance, the iodine concentration may be controlled by way of the ratio of reactants and/or the plasma process parameters. In further implementations of the invention, the process parameters for the multiple process cycles may be varied to change the iodine concentration across the thickness of the ruthenium layer. For instance, changing the parameters of each individual process cycle, or groups of successive process cycles, may be used to fabricate a ruthenium layer that has a tailored iodine concentration gradient.

Process parameters that may be manipulated to establish an iodine concentration gradient within the ruthenium layer include, but are not limited to, the specific precursors that are used in each process cycle, how long each precursor is flowed into the reactor during a process cycle, the precursor concentration and flowrate during each process cycle, the co-reactant used, how long each co-reactant is flowed into the reactor during a process cycle, the co-reactant concentration and flowrate during each process cycle, the sequence or order of the precursor and co-reactant, the plasma energy applied (if any), the substrate temperature, the pressure within the reaction chamber, and the carrier gas composition. The various ruthenium precursors used to fabricate a graded ruthenium layer may include the novel, iodine-containing precursors listed above, as well as ruthenium precursors that are iodine-free. For purposes of this specification, the iodine-free ruthenium precursors will be referred to herein as "conventional" ruthenium precursors.

FIG. 5 is a CVD method 500 for fabricating a graded ruthenium layer and a copper interconnect in accordance with another implementation of the invention. First, a semiconductor substrate, such as a silicon wafer, is provided in a reactor (502). The wafer may include a dielectric layer deposited on its surface. The dielectric layer may include one or more trenches and/or vias within which the graded ruthenium layer will be deposited and the copper interconnect will be formed. The process conditions provided above for the substrate and the reactor may be used here.

More than one process cycle may then be carried out in which iodine-containing ruthenium precursors, conventional ruthenium precursors, and at least one co-reactant are introduced into the reactor to react and form a graded ruthenium layer. For instance, in an implementation of the invention, the CVD method 500 may begin by carrying out a first process cycle to deposit a substantially iodine-free ruthenium film adjacent to the dielectric layer (504). The first process cycle introduces one or more conventional ruthenium precursors into the reactor simultaneously with at least one co-reactant.

Any of a wide variety of conventional ruthenium precursors may be used here. Some examples include, but are not limited to, CpRuRCO$_2$ (where R=H or Me), Cp$_2$Ru, (Me$_2$Cp)$_2$Ru, [CpRu(CO)$_2$]$_2$, (Me$_6$benzene)Ru(ethane)$_2$, {COD}Ru(benzene), Ru$_3$(CO)$_{12}$, Ru(CO)$_2$(thd), Ru(acac)$_3$, Ru(thd)$_3$, {COD}Ru(allyl)$_2$, (norbornene)Ru(allyl)$_2$ and (norbornene)Ru(cycloheptenyl). The co-reactant used here may be any of the co-reactants provided above, such as atomic hydrogen, molecular hydrogen, NH$_3$, O$_2$, O$_3$, or an H$_2$ plasma. The process parameters for this first process cycle may include conventional process parameters used for depositing conventional ruthenium layers. As such, since an iodine-free ruthenium precursor is used, the first process cycle deposits a substantially iodine-free ruthenium film on the dielectric layer. This first process cycle may continue until the iodine-free ruthenium film reaches a desired thickness.

Next, a second process cycle is carried out in which an iodine-containing ruthenium film is deposited atop the iodine-free ruthenium film (506). The second process cycle introduces one or more novel, iodine-containing ruthenium precursors into the reactor simultaneously with at least one co-reactant. The novel, iodine-containing ruthenium precursors include [Ru(CO)$_3$(3,5-(I$_3$C)$_2$-pz)]$_2$, Ru(CO)(thd)(3,5-(I$_3$C)$_2$-pz), (acrylonitrile)Ru(CO)$_3$(3,5-(I$_3$C)$_2$-pz), [Ru(CO)$_2$(COD)(3,5-(I$_3$C)$_2$-pz)]$_2$, (butene)Ru(CO)$_2$(3,5-(I$_3$C)$_2$-pz), (benzene)Ru(3,5-(I$_3$C)$_2$-pz), CpRu(CO)(3,5-(I$_3$C)$_2$-pz), [CpRu(CO)(3,5-(I$_3$C)$_2$-pz)]$_2$, (COD)$_2$Ru(3,5-(I$_3$C)$_2$-pz), [Ru(CO)$_2$(Allyl)(3,5-(I$_3$C)$_2$-pz)]$_2$, and [Ru(CO)$_2$(C$_6$H$_8$)(3,5-(I$_3$C)$_2$-pz)]$_2$. The co-reactant includes at least one of atomic hydrogen, molecular hydrogen, NH$_3$, O$_2$, O$_3$, or an H$_2$ plasma.

The various process parameters provided for CVD method 300 above may be used here for the second process cycle of method 500. This second process cycle may continue until the iodine-containing ruthenium film reaches a desired thickness. The combination of the iodine-containing ruthenium film and the iodine-free ruthenium film forms a graded ruthenium layer in accordance with implementations of the invention.

The reactor may then be purged (508). The purge gas may be an inert gas such as Ar, Xe, N$_2$, He, or forming gas and the duration of the purge may range from 0.1 seconds to 10 seconds, depending on the CVD reactor configurations and other deposition conditions. In most implementations of the invention, the purge may range from 0.5 seconds to 5 seconds.

After the graded ruthenium layer is fabricated, the substrate may be transferred to a reactor containing a plating bath and a plating process may be carried out to deposit a copper layer over the graded ruthenium layer to form a copper interconnect (510). In some implementations, the plating bath is an electroplating bath and the plating process is an electroplating process that is catalyzed by the inclusion of iodine in the graded ruthenium layer. In other implementations, the plating bath is an electroless plating bath and the plating process is an electroless plating process that is also catalyzed by the inclusion of iodine in the graded ruthenium layer. In further implementations, a copper seed layer may be deposited using a CVD or ALD process prior to filling the trench using an electroplating process. In another implementation, the entire copper interconnect may be deposited using only a CVD or ALD process where the iodine catalyzes a gas-phase deposition gap-fill. Finally, a CMP process may be used to planarize the deposited copper metal and finalize the copper interconnect structure (512).

In alternate implementations of the invention, additional process cycles may be included to further tailor the iodine concentration gradient within the ruthenium layer. For example, in one such implementation, an additional process cycle may be carried out between the first and second process cycles of method 500 to generate an iodine-containing ruthenium film that has a lower iodine concentration than the iodine-containing ruthenium film generated in the second process cycle. To do this, the additional process cycle may introduce a mixture of an iodine-containing ruthenium precursor and an iodine-free ruthenium precursor, thereby diluting the iodine concentration. The iodine concentration gradient may be even further refined through additional process cycles in which the ratio of iodine-containing ruthenium precursor to iodine-free ruthenium precursor is varied per process cycle.

FIG. 6 is an ALD method 600 for fabricating a graded ruthenium barrier layer and a copper interconnect in accordance with an implementation of the invention. The method 600 begins by providing a semiconductor substrate onto which the copper interconnect may be formed (602). The substrate may be a silicon wafer having at least one dielectric layer deposited on its surface. The dielectric layer may include one or more trenches and/or vias within which the ruthenium layer will be deposited and the copper interconnect will be formed. The substrate may be housed in a reactor in preparation for the ALD process. The process conditions provided above for the substrate and the reactor may be used here.

Next, multiple process cycles are carried out in which multiple precursors and at least one co-reactant are introduced into the reactor to react and form a graded ruthenium layer. Each precursor and each co-reactant may be introduced in separate pulses and the reactor is generally purged between pulses. In one implementation of the invention, a first process cycle 604 may be executed multiple times to generate an iodine-free ruthenium film on the dielectric layer of the substrate. A second process cycle 616 may then be executed multiple times to deposit an iodine-containing ruthenium film on the iodine-free ruthenium film. The combination of the iodine-containing ruthenium film and the iodine-free ruthenium film forms a graded ruthenium layer in accordance with implementations of the invention.

The first process cycle 604 may begin with at least one pulse of a conventional ruthenium precursor (606). The conventional ruthenium precursor may be chosen from the iodine-free conventional precursors provided above and the conventional ruthenium precursor pulse may be run using process parameters typical for an ALD deposition of ruthenium.

After the at least one pulse of the conventional ruthenium precursor, the reactor may be purged (608). The purge gas may be an inert gas such as Ar, Xe, $N_2$, He, or forming gas and the duration of the purge may range from 0.1 seconds to 60 seconds, depending on the ALD reactor configurations and other deposition conditions.

At least one pulse of a co-reactant is then introduced into the reactor to react with the conventional ruthenium precursor (610). In some implementations the co-reactant may be atomic hydrogen, molecular hydrogen, $NH_3$, $O_2$, or $O_3$. In further implementations, an $H_2$ plasma or other plasma may be employed as a co-reactant in addition to or in lieu of the co-reactants provided above. Conventional process parameters may be used for the co-reactant pulse as described above. After the at least one pulse of the co-reactant, the reactor may again be purged (612).

The first process cycle 604 forms a substantially iodine-free ruthenium film on the substrate. The process cycle 604 may be repeated multiple times until the iodine-free ruthenium film is built up to a desired thickness (614).

The second process cycle 616 may begin with at least one pulse of a novel, iodine-containing ruthenium precursor into the reactor (618). Iodine-containing ruthenium precursors that may be used here include $[Ru(CO)_3(3,5-(I_3C)_2-pz)]_2$, $Ru(CO)(thd)(3,5-(I_3C)_2-pz)$, $(acrylonitrile)Ru(CO)_3(3,5-(I_3C)_2-pz)$, $[Ru(CO)_2(COD)(3,5-(I_3C)_2-pz)]_2$, $(butene)Ru(CO)_2(3,5-(I_3C)_2-pz)$, $(benzene)Ru(3,5-(I_3C)_2-pz)$, $CpRu(CO)(3,5-(I_3C)_2-pz)$, $[CpRu(CO)(3,5-(I_3C)_2-pz)]_2$, $(COD)_2Ru(3,5-(I_3C)_2-pz)$, $[Ru(CO)_2(Allyl)(3,5-(I_3C)_2-pz)]_2$, and $[Ru(CO)_2(C_6H_8)(3,5-(I_3C)_2-pz)]_2$. The process parameters provided for ALD method 400 above may be used for the second process cycle 616.

After the at least one pulse of the iodine-containing ruthenium precursor, the reactor may be purged (620). Again, the purge gas may be an inert gas such as Ar, Xe, $N_2$, He, or forming gas and the duration of the purge may range from 0.1 seconds to 60 seconds, depending on the ALD reactor configurations and other deposition conditions.

At least one pulse of a co-reactant is then introduced into the reactor to react with the iodine-containing ruthenium precursor (622). In some implementations the co-reactant may be atomic hydrogen, molecular hydrogen, $NH_3$, $O_2$, or $O_3$. In further implementations, an $H_2$ plasma or other plasma may be employed as a co-reactant in addition to or in lieu of the coreactants provided above. The process parameters provided for ALD method 400 above may be used for the co-reactant pulse. After the at least one pulse of the co-reactant, the reactor may again be purged (624).

The second process cycle 616 forms an iodine-containing ruthenium film on the iodine-free ruthenium film. The process cycle 616 may be repeated multiple times until the iodine-containing ruthenium film is built up to a desired thickness (626). The end result is a graded iodine-containing ruthenium layer.

Following the formation of the graded ruthenium layer, the reactor may be purged (628) and the substrate may then be transferred to a reactor containing a plating bath where a plating process may be carried out to deposit a copper layer over the graded ruthenium layer to form a copper interconnect (630). In some implementations, the plating bath is an electroplating bath and the plating process is an electroplating process that is catalyzed by the inclusion of iodine in the ruthenium layer. In other implementations, the plating bath is an electroless plating bath and the plating process is an electroless plating process that is also catalyzed by the inclusion of iodine in the ruthenium layer. In further implementations, a copper seed layer may be deposited using a CVD or ALD process prior to filling the trench using an electroplating process. In another implementation, the entire copper interconnect may be deposited using only a CVD or ALD process where the iodine catalyzes a gas-phase deposition gap-fill. Finally, a CMP process may be used to planarize the deposited copper metal and finalize the copper interconnect structure (632).

It should be noted that in alternate implementations of the invention, the order of reactants may be changed. For instance, the first and second process cycles may each begin by pulsing one or more of the co-reactants into the reactor. The co-reactant pulses may be followed by a reactor purge and then the ruthenium precursor pulse.

As described above for the CVD process, in alternate implementations of the invention, additional process cycles may be included to further tailor the iodine concentration gradient within the ruthenium layer. For example, in one such implementation, an additional process cycle may be carried out between the first and second process cycles of method 600 to generate an iodine-containing ruthenium film that has a lower iodine concentration than the iodine-containing ruthenium film generated in the second process cycle. To do this, the additional process cycle may separately or simultaneously pulse both an iodine-containing ruthenium precursor and an iodine-free ruthenium precursor, thereby diluting the iodine concentration. The iodine concentration gradient may be even further refined through additional process cycles in which the ratio of iodine-containing ruthenium precursor to iodine-free ruthenium precursor is varied per process cycle.

In still further implementations of the invention, the CVD and ALD process cycles described here to form the graded ruthenium layer may be modified further to form a more linear concentration gradient of iodine in the ruthenium layer. For instance, a series of process cycles may be used in which the iodine concentration gradually increases in each subsequent process cycle of the series. This can be done by, for example, increasing the amount of iodine-containing ruthenium precursor relative to iodine-free ruthenium precursor in each process cycle. This implementation produces a ruthenium layer having a substantially linear concentration gradient of iodine.

Accordingly, both CVD and ALD processes have been described that enable the growth of conformal thin films of iodine-doped ruthenium that may be used in sub-100 nm VLSI interconnect structures. The resulting ruthenium layer has properties allowing direct copper plating without the need for an additional copper seed layer. Also, the doping with iodine allows for the possibility of a gas-phase gap-fill copper process. Furthermore, the processes described herein takes place at temperatures that are compatible with back-end semiconductor process technologies (i.e., less than 400° C.). And finally, the thinness of the ruthenium barrier/adhesion layer allows for a higher overall copper line volume leading to lower line resistivity and RC delay.

As described above, the iodine-doped ruthenium layers fabricated in accordance with implementations of the invention have decreased surface roughness due to the presence of the iodine. The iodine also catalytically enhances the copper deposition process carried out on the ruthenium layer. Finally, the novel precursors provided above enable a fluorine-free process to be used to form the ruthenium layers.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A method comprising:
providing a semiconductor substrate in a reactor, wherein the semiconductor substrate includes a trench etched into a dielectric layer;
introducing a ruthenium precursor and a co-reactant into the reactor proximate to the semiconductor substrate to form a ruthenium containing layer, wherein the ruthenium precursor comprises at least one of $[Ru(CO)_3(3,5-(I_3C)_2-pz)]_2$, $Ru(CO)(thd)(3,5-(I_3C)_2-pz)$, $(acrylonitrile)Ru(CO)_3(3,5-(I_3C)_2-pz)$, $[Ru(CO)_2(COD)(3,5-(I_3C)_2-pz)]_2$, $(butene)Ru(CO)_2(3,5-(I_3C)_2-pz)$, $(benzene)Ru(3,5-(I_3C)_2-pz)$, $CpRu(CO)(3,5-(I_3C)_2-pz)$, $[CpRu(CO)(3,5-(I_3C)_2-pz)]_2$, $(COD)_2Ru(3,5-(I_3C)_2-pz)$, $[Ru(CO)_2(Allyl)(3,5-(I_3C)_2-pz)]_2$, or $[Ru(CO)_2(C_6H_8)(3,5-(I_3C)_2-pz)]_2$; and
depositing a metal layer on the ruthenium containing layer.

2. The method of claim 1, wherein the depositing of the metal layer comprises:
transferring the semiconductor substrate to a metal plating bath; and
depositing the metal layer on the ruthenium containing layer using a plating process.

3. The method of claim 2, wherein the plating bath comprises an electroplating bath and the plating process comprises an electroplating process.

4. The method of claim 2, wherein the plating bath comprises an electroless plating bath and the plating process comprises an electroless plating process.

5. The method of claim 2, wherein the metal comprises copper.

6. The method of claim 1, wherein the depositing of the metal layer comprises using a CVD process to deposit the metal layer.

7. The method of claim 1, wherein the depositing of the metal layer comprises using an ALD process to deposit the metal layer.

8. The method of claim 1, wherein the co-reactant comprises at least one of atomic hydrogen, $H_2$, $NH_3$, $O_2$, $O_3$, $BH_3$, $B_2H_6$, catechol-borane, $CH_4$, $SiH_4$, $GeH_4$, metal hydrides, CO, ethanol, or a metal precursor.

9. The method of claim 8, wherein the co-reactant is combined with a plasma.

10. The method of claim 1, further comprising forming a metal seed layer on the ruthenium containing layer prior to depositing the metal layer.

11. The method of claim 1, wherein an RF energy source is applied in the reactor during the introduction of the ruthenium precursor and the co-reactant, wherein the RF energy source has a power that ranges from 5 W to 200 W and a frequency of 13.56 MHz, 27 MHz, or 60 MHz.

12. A method comprising:
providing a semiconductor substrate in a reactor, wherein the semiconductor substrate includes a trench etched into a dielectric layer;
pulsing a ruthenium precursor into the reactor proximate to the semiconductor substrate, wherein the ruthenium precursor comprises at least one of $[Ru(CO)_3(3,5-(I_3C)_2-pz)]_2$, $Ru(CO)(thd)(3,5-(I_3C)_2-pz)$, $(acrylonitrile)Ru(CO)_3(3,5-(I_3C)_2-pz)$, $[Ru(CO)_2(COD)(3,5-(I_3C)_2-pz)]_2$, $(butene)Ru(CO)_2(3,5-(I_3C)_2-pz)$, $(benzene)Ru(3,5-(I_3C)_2-pz)$, $CpRu(CO)(3,5-(I_3C)_2-pz)$, $[CpRu(CO)(3,5-(I_3C)_2-pz)]_2$, $(COD)_2Ru(3,5-(I_3C)_2-pz)$, $[Ru(CO)_2(Allyl)(3,5-(I_3C)_2-pz)]_2$, or $[Ru(CO)_2(C_6H_8)(3,5-(I_3C)_2-pz)]_2$;
purging the reactor after the precursor pulse;
pulsing a co-reactant into the reactor proximate to the semiconductor substrate, wherein the co-reactant reacts with the ruthenium precursor to form a ruthenium containing layer on the substrate;
purging the reactor after the co-reactant pulse; and
depositing a metal layer on the ruthenium containing layer.

13. The method of claim 12, wherein the depositing of the metal layer comprises:
transferring the semiconductor substrate to a plating bath; and
depositing the metal layer using a plating process.

14. The method of claim 13, wherein the plating bath comprises an electroplating bath and the plating process comprises an electroplating process.

15. The method of claim 13, wherein the plating bath comprises an electroless plating bath and the plating process comprises an electroless plating process.

16. The method of claim 13, wherein the metal comprises copper.

17. The method of claim 12, wherein the depositing of the metal layer comprises using a CVD process to deposit the metal layer.

18. The method of claim 12, wherein the depositing of the metal layer comprises using an ALD process to deposit the metal layer.

19. The method of claim 12, wherein the co-reactant comprises at least one of atomic hydrogen, $H_2$, $NH_3$, $O_2$, $O_3$, $BH_3$, $B_2H_6$, catechol-borane, $CH_4$, $SiH_4$, $GeH_4$, metal hydrides, CO, ethanol, an $H_2$ plasma, or a metal precursor.

20. The method of claim 12, wherein the pulsing of the ruthenium precursor, the purging of the reactor after the precursor pulse, the pulsing of the co-reactant, and the purging of the reactor after the co-reactant pulse are repeated until the ruthenium containing layer reaches a predetermined thickness.

21. The method of claim 20, wherein the predetermined thickness ranges from 1 nm to 15 nm.

22. The method of claim 12, further comprising depositing a metal seed layer on the ruthenium containing layer prior to depositing the metal layer.

23. The method of claim 12, wherein an RF energy source is applied in the reactor during the pulsing of at least one of the ruthenium precursor and the co-reactant, wherein the RF energy source has a power that ranges from 5 W to 200 W and a frequency of 13.56 MHz, 27 MHz, or 60 MHz.

24. A method comprising:
providing a semiconductor substrate in a reactor, wherein the semiconductor substrate includes a trench etched into a dielectric layer;
introducing an iodine-free ruthenium precursor and a first co-reactant into the reactor proximate to the semiconductor substrate to form an iodine-free ruthenium layer;
introducing an iodine-containing ruthenium precursor and a second co-reactant into the reactor proximate to the semiconductor substrate to form an iodine-doped ruthenium layer atop the iodine-free ruthenium layer, wherein the iodine-containing ruthenium precursor comprises at least one of $[Ru(CO)_3(3,5-(I_3C)_2-pz)]_2$, $Ru(CO)(thd)(3,5-(I_3C)_2-pz)$, (acrylonitrile)$Ru(CO)_3(3,5-(I_3C)_2-pz)$, $[Ru(CO)_2(COD)(3,5-(I_3C)_2-pz)]_2$, (butene)$Ru(CO)_2(3,5-(I_3C)_2-pz)$, (benzene)$Ru(3,5-(I_3C)_2-pz)$, $CpRu(CO)(3,5-(I_3C)_2-pz)$, $[CpRu(CO)(3,5-(I_3C)_2-pz)]_2$, $(COD)_2Ru(3,5-(I_3C)_2-PZ)$, $[Ru(CO)_2(Allyl)(3,5-(I_3C)_2-pz)]_2$, or $[Ru(CO)_2(C_6H_8)(3,5-(I_3C)_2-pz)]_2$; and
depositing a metal layer on the iodine-doped ruthenium layer.

25. The method of claim 24, wherein the depositing of the metal layer comprises:
transferring the semiconductor substrate to a plating bath; and
depositing the metal layer on the iodine-doped ruthenium layer using a plating process.

26. The method of claim 25, wherein the plating bath comprises an electroplating bath and the plating process comprises an electroplating process.

27. The method of claim 25, wherein the plating bath comprises an electroless plating bath and the plating process comprises an electroless plating process.

28. The method of claim 24, wherein the depositing of the metal layer comprises using a CVD process to deposit the metal layer.

29. The method of claim 24, wherein the depositing of the metal layer comprises using an ALD process to deposit the metal layer.

30. The method of claim 24, wherein the first co-reactant comprises at least one of atomic hydrogen, $H_2$, $NH_3$, $O_2$, $O_3$, $BH_3$, $B_2H_6$, catechol-borane, $CH_4$, $SiH_4$, $GeH_4$, metal hydrides, CO, ethanol, or a metal precursor.

31. The method of claim 30, wherein the first co-reactant is combined with a plasma.

32. The method of claim 24, wherein the second co-reactant comprises at least one of atomic hydrogen, $H_2$, $NH_3$, $O_2$, $O_3$, $BH_3$, $B_2H_6$, catechol-borane, $CH_4$, $SiH_4$, $GeH_4$, metal hydrides, CO, ethanol, or a metal precursor.

33. The method of claim 32, wherein the second co-reactant is combined with a plasma.

34. The method of claim 24, wherein an RF energy source is applied in the reactor during the introduction of the iodine-free ruthenium precursor and the first co-reactant, wherein the RF energy source has a power that ranges from 5 W to 200 W and a frequency of 13.56 MHz, 27 MHz, or 60 MHz.

35. The method of claim 24, wherein an RF energy source is applied in the reactor during the introduction of the iodine-containing ruthenium precursor and the second co-reactant, wherein the RF energy source has a power that ranges from 5 W to 200 W and a frequency of 13.56 MHz, 27 MHz, or 60 MHz.

36. The method of claim 24, further comprising introducing the iodine-free ruthenium precursor, the iodine-containing ruthenium precursor, and at least one of the first co-reactant and the second co-reactant into the reactor proximate to the semiconductor substrate to form a second iodine-doped ruthenium layer, wherein an iodine concentration of the second iodine-doped ruthenium layer is lower than an iodine concentration of the iodine-doped ruthenium layer.

37. A method comprising:
providing a semiconductor substrate in a reactor, wherein the semiconductor substrate includes a trench etched into a dielectric layer:
carrying out a first process cycle, wherein the first process cycle comprises:
pulsing an iodine-free ruthenium precursor into the reactor proximate to the semiconductor substrate,
purging the reactor after the iodine-free ruthenium precursor pulse,
pulsing a first co-reactant into the reactor proximate to the semiconductor substrate, wherein the first co-reactant reacts with the iodine-free ruthenium precursor to form an iodine-free ruthenium layer on the substrate, and
purging the reactor after the first co-reactant pulse;
carrying out a second process cycle, wherein the second process cycle comprises:
pulsing an iodine-containing ruthenium precursor into the reactor proximate to the semiconductor substrate, wherein the iodine-containing ruthenium precursor comprises at least one of $[Ru(CO)_3(3,5-(I_3C)_2-pz)]_2$, $Ru(CO)(thd)(3,5-(I_3C)_2-pz)$, (acrylonitrile)$Ru(CO)_3(3,5-(I_3C)_2-pz)$, $[Ru(CO)_2(COD)(3,5-(I_3C)_2-pz)]_2$, (butene)$Ru(CO)_2(3,5-(I_3C)_2-pz)$, (benzene)$Ru(3,5-(I_3C)2-pz)$, $CpRu(CO)(3,5-(I_3C)_2-pz)$, $[CpRu(CO)(3,5-(I_3C)_2-pz)]_2$, $(COD)_2Ru(3,5-(I_3C)_2-pz)$, $[Ru(CO)_2(Allyl)(3,5-(I_3C)_2-pz)]_2$, or $[Ru(CO)_2(C_6H_8)(3,5-(I_3C)_2-pz)]_2$,
purging the reactor after the iodine-containing ruthenium precursor pulse,
pulsing a second co-reactant into the reactor proximate to the semiconductor substrate, wherein the second co-reactant reacts with the iodine-containing ruthenium precursor to form an iodine-doped ruthenium layer on the iodine-free ruthenium layer, and
purging the reactor after the second co-reactant pulse; and
depositing a metal layer on the iodine-doped ruthenium layer.

38. The method of claim 37, wherein the depositing of the metal layer comprises:
transferring the semiconductor substrate to a plating bath; and
depositing the metal layer on the iodine-doped ruthenium layer using a plating process.

39. The method of claim 37, wherein the depositing of the metal layer comprises using a CVD process to deposit the metal layer.

40. The method of claim 37, wherein the depositing of the metal layer comprises using an ALD process to deposit the metal layer.

41. The method of claim 37, wherein the first co-reactant comprises at least one of atomic hydrogen, $H_2$, $NH_3$, $O_2$, $O_3$, $BH_3$, $B_2H_6$, catechol-borane, $CH_4$, $SiH_4$, $GeH_4$, metal hydrides, CO, ethanol, or a metal precursor.

42. The method of claim 41, wherein the first co-reactant is combined with a plasma.

43. The method of claim 37, wherein the second co-reactant comprises at least one of atomic hydrogen, $H_2$, $NH_3$, $O_2$, $O_3$, $BH_3$, $B_2H_6$, catechol-borane, $CH_4$, $SiH_4$, $GeH_4$, metal hydrides, CO, ethanol, or a metal precursor.

44. The method of claim 43, wherein the second co-reactant is combined with a plasma.

45. The method of claim 37, further comprising carrying out a third process cycle between the first and second process cycles, wherein the third process cycle comprises:
pulsing an iodine-free ruthenium precursor into the reactor proximate to the semiconductor substrate,
purging the reactor after the iodine-free ruthenium precursor pulse,
pulsing an iodine-containing ruthenium precursor into the reactor proximate to the semiconductor substrate,
purging the reactor after the iodine-containing ruthenium precursor pulse, and
pulsing at least one co-reactant into the reactor proximate to the semiconductor substrate, wherein the iodine-free ruthenium precursor, the iodine-containing ruthenium precursor, and the at least one co-reactant react to form a second iodine-doped ruthenium layer on the substrate, wherein an iodine concentration of the second iodine-doped ruthenium layer is lower than an iodine concentration of the iodine-doped ruthenium layer.

* * * * *